US006303965B1

(12) United States Patent
Schuegraf

(10) Patent No.: US 6,303,965 B1
(45) Date of Patent: Oct. 16, 2001

(54) RESISTOR CONSTRUCTIONS AND METHODS OF FORMING RESISTOR CONSTRUCTIONS

(75) Inventor: Klaus Florian Schuegraf, Aliso Viejo, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/378,434

(22) Filed: Aug. 20, 1999

(Under 37 CFR 1.47)

(51) Int. Cl.[7] .................................................... H01L 29/76
(52) U.S. Cl. ........................ 257/379; 257/903; 257/904; 438/381; 438/382; 438/384
(58) Field of Search ................................ 257/537, 536, 257/690, 711, 692, 296, 300, 306, 350, 379, 408, 538, 756, 903, 904; 338/308; 438/253, 200, 210, 381, 382, 384

(56) References Cited

U.S. PATENT DOCUMENTS

| | | | |
|---|---|---|---|
| 4,609,903 | * | 9/1986 | Toyokura et al. . |
| 5,049,970 | | 9/1991 | Tanaka et al. ........................... 357/51 |
| 5,093,706 | * | 3/1992 | Mitsuhashi et al. . |
| 5,140,299 | * | 8/1992 | Andrews, Jr. et al. ............... 338/308 |
| 5,200,356 | | 4/1993 | Tanaka .................................... 437/60 |

OTHER PUBLICATIONS

Shubat, A., et al., "A Bipolar Load CMOS SRAM Cell for Embedded Applications", *IEEE* vol. 16, No. 5, May 1995; pp. 169–171.

Okumura, T., et al., "A $SiO_x$ Resistor Load SRAM Process for ASIC Applications", 1988; pp. 25.6.1–25.6.4.

* cited by examiner

*Primary Examiner*—Nathan Flynn
*Assistant Examiner*—Kevin Quinto
(74) *Attorney, Agent, or Firm*—Wells, St. John, Roberts, Gregory & Matkin, P.S.

(57) ABSTRACT

The invention encompasses resistors comprising a thin layer of dielectric material and methods of forming such resistors. The invention also encompasses integrated circuitry comprising such resistors, including SRAM circuitry, and encompasses methods of forming such integrated circuitry. In one aspect, the invention includes a resistor construction for electrically connecting a first node location to a second node location comprising: a) a first conductive layer in electrical connection with the first node location; b) a second conductive layer in electrical connection with the second node location; and c) a dielectric material intermediate the first conductive layer and the second conductive layer and having a thickness of from about 15 Angstroms to about 60 Angstroms. In another aspect, the invention includes a resistor construction for electrically connecting a first node location to a second node location comprising: a) a dielectric material in electrical connection with the first node location and having a thickness of no greater than about 60 Angstroms; and b) a conductive layer over the dielectric material and in electrical connection with the second node location.

11 Claims, 4 Drawing Sheets

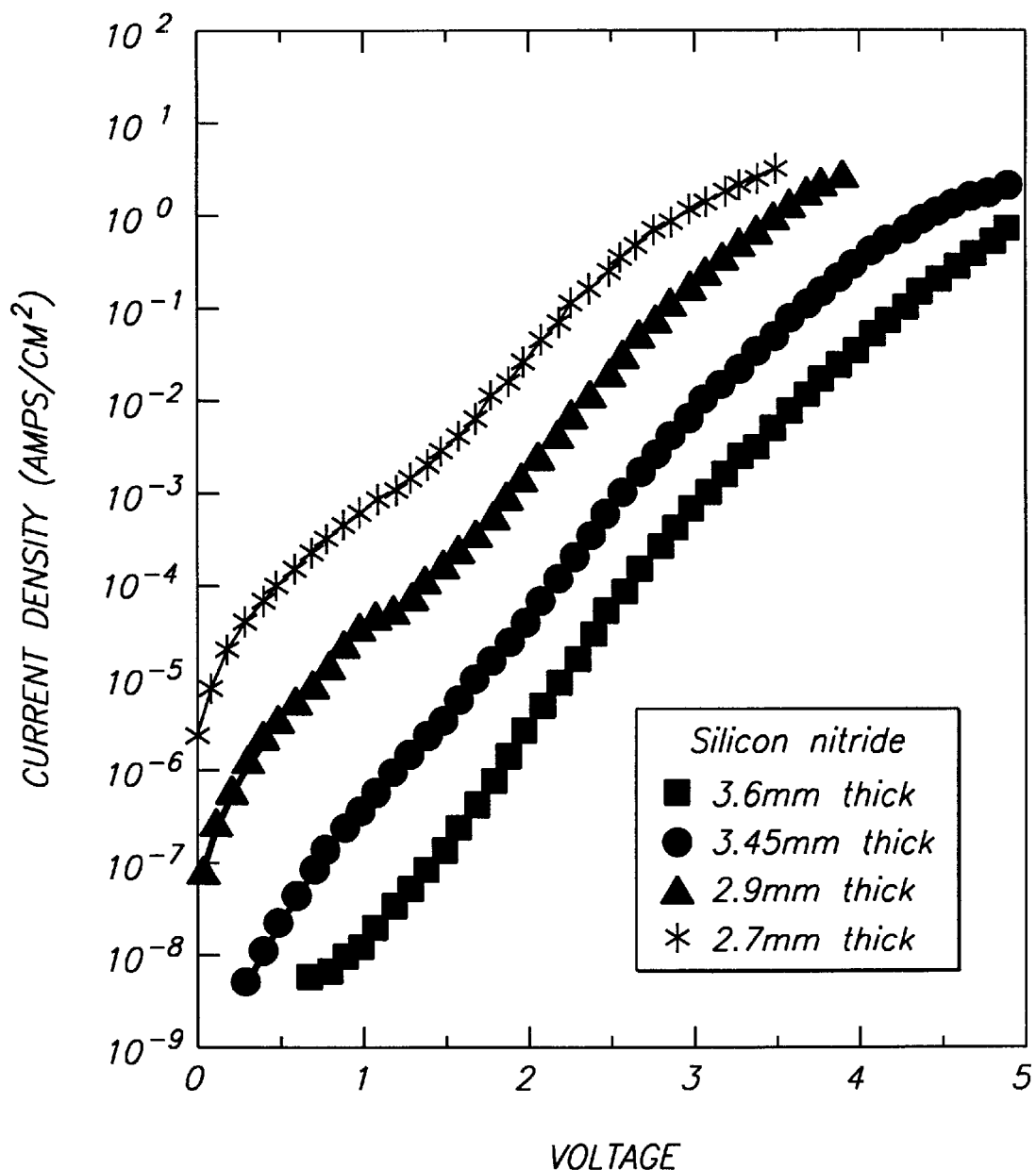
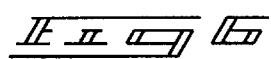

RESISTOR CONSTRUCTIONS AND METHODS OF FORMING RESISTOR CONSTRUCTIONS

TECHNICAL FIELD

This invention relates to formation of resistors, to formation of static random access memory (SRAM) circuitry, and to integrated circuitry.

BACKGROUND OF THE INVENTION

This invention arose from challenges associated with fabrication of resistors for SRAM circuitry and will be described relative to SRAM circuitry. However, the invention will have applicability to other circuitry, as the artisan will appreciate, with the invention only being limited by the accompanying claims appropriately interpreted in accordance with the Doctrine Of Equivalents.

An SRAM cell is said to be bistable because it has two stable or self-maintaining operating states, corresponding to two different output voltages. The different output voltages correspond to a binary stored "1" or a "0". Without external stimuli, a static memory cell will operate continuously in a single one of its two operating states. It has internal feedback to maintain a stable voltage differential between the two nodes of the cell. The polarity of this voltage difference is sensed by external circuitry to determine the operating state of the memory cell. The two possible output voltages produced by a static memory cell are determined by the upper and lower circuit supply voltages. Intermediate output voltages may occur transiently during performance of the SRAM cell.

The operation of a static memory cell is in contrast to other types of memory cells, such as DRAM cells, which do not have stable operating states. A DRAM cell can be programmed to store a voltage which represents one of two binary values, but requires periodic reprogramming or "refreshing" to maintain this voltage for more than very short time periods.

FIG. 1 shows an example prior art SRAM cell 350 such as is typically used in high-density static random access memories. Static memory cell 350 comprises n-channel pulldown (driver) transistors 380 and 382 having drains respectively connected to load resistors 384 and 386. Transistors 380 and 382 are typically metal oxide silicon field effect transistors (MOSFETs) formed in an underlying silicon semiconductor substrate.

The source regions of transistors 380 and 382 are tied to a low reference or circuit supply voltage, labeled $V_{ss}$ which is typically referred to as "ground." Resistors 384 and 386 are respectively connected in series between a high reference or circuit supply voltage, labeled $V_{cc}$, and the drains of the corresponding transistors 380 and 382. The drain of transistor 382 is connected to the gate of transistor 380 by a line 376, and the drain of transistor 380 is connected to the gate of transistor 382 by a line 374 to form flip-flop having a pair of complementary two-state outputs.

A memory flip-flop, such as that described above in connection with FIG. 1, forms one memory element of an integrated array of static memory elements. A pair of access transistors, such as access transistors 390 and 392, are provided to selectively address and access individual memory elements within the array. Access transistor 390 has one active terminal connected to the drain of transistor 380. Access transistor 392 has one active terminal connected to the drain of transistor 382. A plurality of complementary column line pairs, such as the single pair of complementary column lines 352 and 354 as shown, are connected to the remaining active terminals of access transistors 390 and 392, respectively. A row line 356 is connected to the gates of access transistors 390 and 392.

Reading static memory cell 350 requires activating row line 356 to connect outputs 368 and 372 to column lines 352 and 354. Writing to static memory cell 350 requires first placing selected complementary logic voltages on column lines 352 and 354, and then activating row line 356 to connect those logic voltages to outputs 368 and 372. This forces the outputs to the selected logic voltages, which will be maintained as long as power is supplied to the memory cell, or until the memory cell is reprogrammed.

Resistors 384 and 386 are commonly fabricated from highly resistive forms of polysilicon. It would be desirable to provide alternative resistor constructions.

SUMMARY OF THE INVENTION

The invention encompasses resistors comprising a thin layer of dielectric material and methods of forming such resistors. The invention also encompasses integrated circuitry comprising such resistors, including SRAM circuitry, and encompasses methods of forming such integrated circuitry.

BRIEF DESCRIPTION OF THE DRAWINGS

Preferred embodiments of the invention are described below with reference to the following accompanying drawings.

FIG. 6 is a graph of current density vs. voltage for silicon nitride layers of varying thickness.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
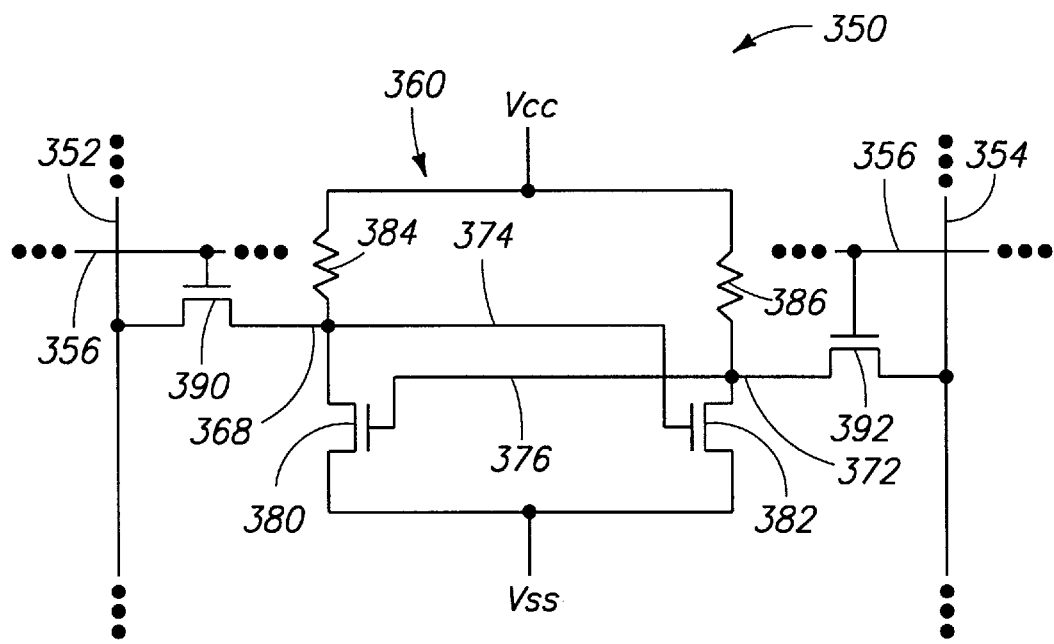
FIG. 1 is a schematic representation of a four transistor SRAM cell, and is discussed principally in the "Background" section above.
Figure 2:
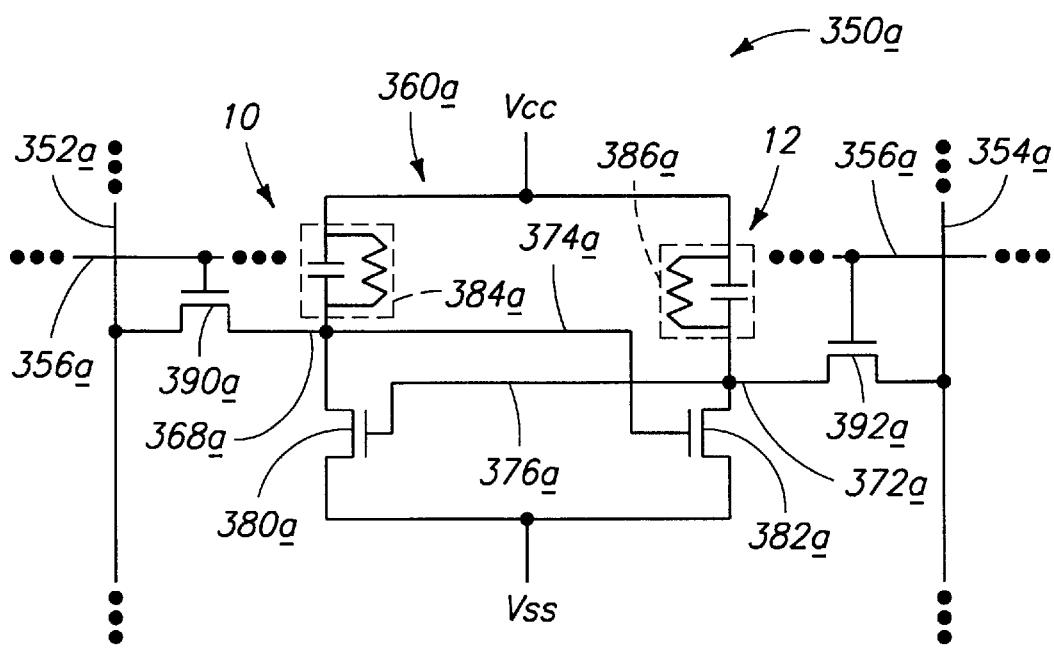
FIG. 2 is a schematic representation of a four transistor SRAM cell comprising resistors encompassed by the present invention.

Referring initially to FIG. 2, a four transistor SRAM cell comprising resistor constructions encompassed by the present invention is illustrated. Like numerals from the preceding discussion of the prior art are utilized where appropriate, with differences being indicated by the suffix "a" or with different numerals. SRAM cell 350a comprises resistor constructions 384a and 386a. A primary difference between SRAM cell 350a (shown in FIG. 2) and prior art SRAM cell 350 (shown in FIG. 1) is that SRAM cell 350a comprises resistor constructions 384a and 386a having leaky capacitor-like constructions 10 and 12, respectively.

As will be discussed in more detail below, capacitor-like constructions 10 and 12 comprise a leaky dielectric material layer. Such leaky dielectric material creates a relatively high resistance within constructions 10 and 12, but permits electrons to flow through the constructions 10 and 12. Accordingly, capacitor-like constructions 10 and 12 are similar to capacitors in that they comprise a dielectric material layer, but are different from capacitors in that the dielectric material layer of constructions 10 and 12 permits a relatively continuous electron flow. Capacitors 10 and 12 thus provide ohmic resistance within SRAM cell 350a. The term "ohmic resistance" is utilized herein to distinguish the resistive properties of constructions 10 and 12 from capacitive reactance.

Figure 3:
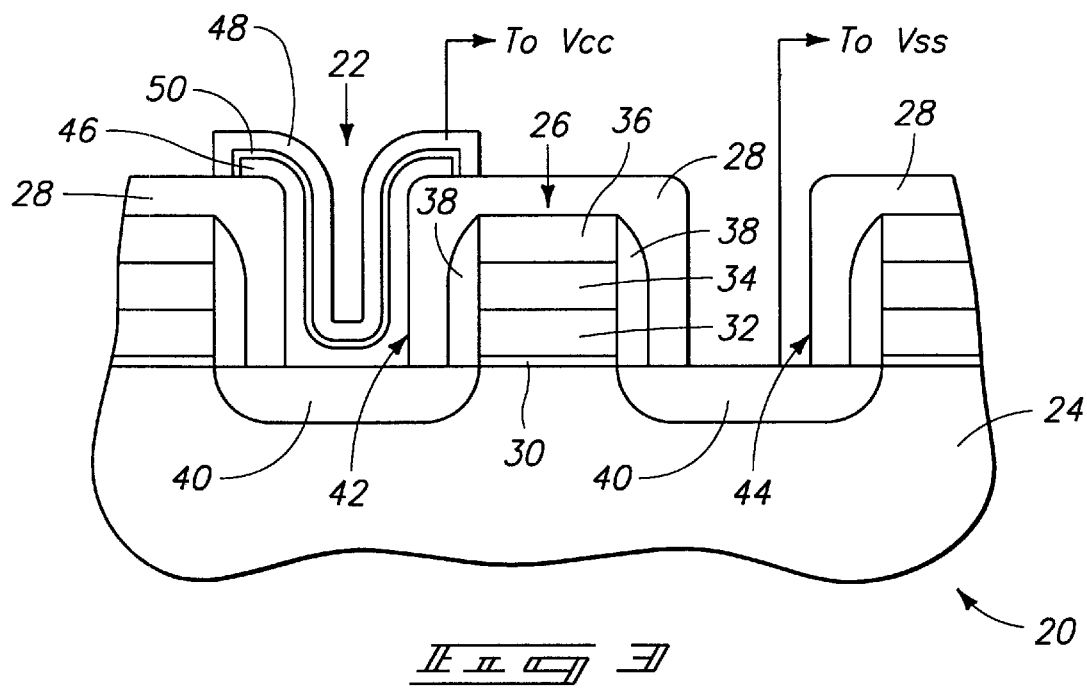
FIG. 3 is a diagrammatic fragmentary sectional view of a semiconductor wafer fragment comprising a first embodiment resistor encompassed by the present invention.

Exemplary resistor constructions encompassed by the present invention are described with reference to FIGS. 3 and 4. Referring to FIG. 3, a semiconductor wafer fragment 20 is illustrated comprising a resistor structure 22 exemplifying a first embodiment of the present invention. Wafer fragment 20 further comprises a semiconductive substrate 24, a transistor gate 26, and an insulative layer 28 over transistor gate 26 and over semiconductive substrate 24. Transistor gate 26 comprises a gate oxide layer 30, a polysilicon layer 32, a silicide layer 34, an insulative cap 36, and sidewall spacers 38. Transistor gate 26 is illustrated as being incorporated into an SRAM, and could be either of the transistors 380a or 382a in FIG. 2.

Source/drain regions 40 are adjacent transistor gate 26 and within substrate 24. One of the source/drain regions 40 is electrically connected to $V_{cc}$ and the other of the source/drain regions 40 is connected to $V_{ss}$. A first contact opening 42 extends through insulative layer 28 to one of the source/drain regions 40 and a second contact opening 44 extends through insulative layer 28 to the other of source/drain regions 40. Contact openings 42 and 44 permit electrical connection to $V_{cc}$ and $V_{ss}$ from source/drain regions 40. Conductive material will ultimately be formed within contact opening 44 for connecting to $V_{ss}$. Such conductive material is not shown, however, as it is not germane to the present invention.

Resistor construction 22 is formed within contact opening 42. Resistor construction 22 comprises a first conductive layer 46 in electrical connection with source/drain region 40, a second conductive layer 48 in electrical connection with $V_{cc}$, and a dielectric material 50 intermediate first conductive layer 46 and second conductive layer 48.

First conductive layer 46 and second conductive layer 48 preferably comprise conductively doped polysilicon. First conductive layer 46 may be formed directly in contact with a source/drain region 40, as shown. In alternative embodiments, which are not shown, first conductive layer 46 may contact source/drain region 40 through an interconnecting conductive layer formed intermediate first conductive material 46 and source/drain region 40. Such interconnecting conductive layer can, for example be in electrical contact with 380a (FIG. 2) or 382a (FIG. 2) (for instance, in electrical contact with one of 374a or 376a of FIG. 2).

Dielectric material 50 is preferably void of any implanted material, and must therefore be kept very thin to permit current leakage between conductive layers 46 and 48. Accordingly, dielectric material 50 is no greater than about 60 Angstroms thick, and is preferably only about 40 Angstroms thick. However, dielectric material 50 must be thick enough to provide adequate resistance, and is therefore typically at least 15 Angstroms thick. Dielectric material 50 will preferably comprise either silicon dioxide or silicon nitride. It is preferred that dielectric material 50 not be subject to an implant of any dopant material because such implant would reduce the resistance characteristics of material 50, thus requiring a greater thickness of material 50 to achieve a desired resistance.

Resistor 22 is illustrated in a configuration such as could be utilized in the SRAM construction of FIG. 2. Specifically, resistor construction 22 could form either of the resistors 384a or 386a of FIG. 2, with layers 46, 48 and 50 together defining either capacitor-like construction 10 or capacitor-like construction 12. However, as will be recognized by persons of skill in the art, resistor construction 22 may be utilized in other devices in addition to SRAM constructions analogous to FIG. 2. In such devices, resistor construction 22 will electrically connect a first node location with a second node location. Specifically, first layer 46 will be in electrical connection with the first node location and second conductive layer 48 will be in electrical connection with the second node location.

Methods of forming resistor construction 22 will be readily recognized by persons of skill in the art. Such methods will generally comprise forming first conductive layer 46 in electrical connection with a first node location, such as a source/drain region 40. Such methods will generally also comprise forming dielectric material 50 over the first conductive layer, and forming second conductive layer 48 over dielectric material 50. Second conductive layer 48 will be formed in electrical connection with a second node location, such as a node location having a potential of $V_{cc}$.

Resistor device 22 will preferably be operated at a voltage which remains at or below about 3 volts.

Figure 4:
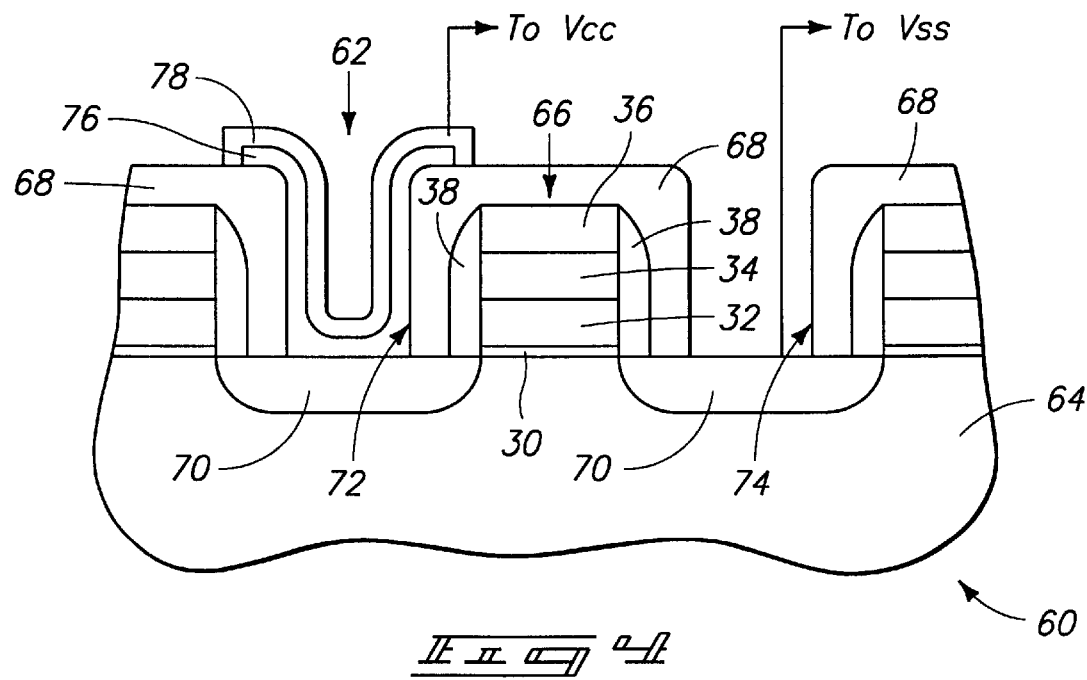
FIG. 4 is a diagrammatic fragmentary sectional view of a semiconductor wafer fragment comprising a second embodiment resistor encompassed by the present invention.

Referring to FIG. 4, a wafer fragment 60 is illustrated comprising a resistor 62 exemplifying a second embodiment the present invention. Wafer fragment 60 also comprises a semiconductive material substrate 64, a transistor gate 66 and an insulative layer 68 over transistor gate 66 and substrate 64. Transistor gate 66 is illustrated as being incorporated into an SRAM, and could be either of the transistors 380a or 382a in FIG. 2. Transistor gate 66 comprises a construction identical to that discussed above regarding transistor gate 26 of FIG. 3.

Source/drain regions 70 are adjacent transistor gate 66. Contact openings 72 and 74 extend through insulative material 68 to source/drain regions 70. Contact openings 72 and 74 permit electrical connection of source/drain regions 70 to $V_{cc}$ and $V_{ss}$ for formation of an SRAM construction, such as that shown in FIG. 2. Typically, a conductive plug would extend within contact opening 74 to connect a source/drain region 70 to $V_{ss}$. However, such conductive plug is not shown in FIG. 4, as such is not germane to the present invention.

Resistor 62 is within contact opening 72 and comprises a dielectric material 76 in electrical connection with a source/drain region 70. Resistor 62 further comprises a conductive layer 78 over dielectric material 76 and in electrical connection with $V_{cc}$. Conductive layer 78 preferably comprises conductively doped polysilicon.

Dielectric material 76 preferably comprises silicon dioxide or silicon nitride. Dielectric material 76 also preferably is void of any implanted material, and comprises a thickness of less than 60 Angstroms, for the reasons discussed above with reference to dielectric material 50 of FIG. 3. Dielectric material 76 is preferably at least about 15 Angstroms thick to provide suitable resistance for structure 62.

If resistor structure 62 is utilized for forming either the resistor 384a or 386a in the SRAM structure of FIG. 2, source/drain region 70, dielectric layer 76 and conductive layer 78 together define either capacitor-like construction 10 or 12. It is noted that one of conductive interconnects 374a or 376a of FIG. 2 could also electrically contact diffusion region 70.

As will be recognized by persons of ordinary skill in the art, resistor construction 62 can be utilized in other applications besides SRAM constructions analogous to that of FIG. 2. In such other applications, resistor construction 62 will electrically connect a first node location to a second node location. Accordingly, dielectric material 76 will be in electrical connection with the first node location and conductive layer 78 will be in electrical connection with the second node location.

Methods for forming resistor construction 62 will be recognized by persons of ordinary skill in the art. Such methods will generally comprise forming dielectric material 76 in electrical connection with a first node location and forming conductive layer 78 against dielectric material 76 and in electrical connection with a second node location.

Resistor construction 62 will preferably be operated at a voltage which remains at or below about 3 volts for reasons similar to those discussed above regarding resistor construction 22 of FIG. 3.

An advantage of the present invention resistor constructions over typical prior art resistor constructions can be that the devices of the present invention are relatively stable to alpha particle hits. Alpha particles occur naturally and can undesirably create carriers in resistant devices when the alpha particles impact such devices (errors introduced by alpha particle impacts are sometimes referred to as "single event upsets" (SEV), or as "soft-error events"). However, the relatively high capacitance of the devices of the present invention can render improved stability of such devices to alpha particle hits relative to lower capacitance prior art devices.

Figure 5:
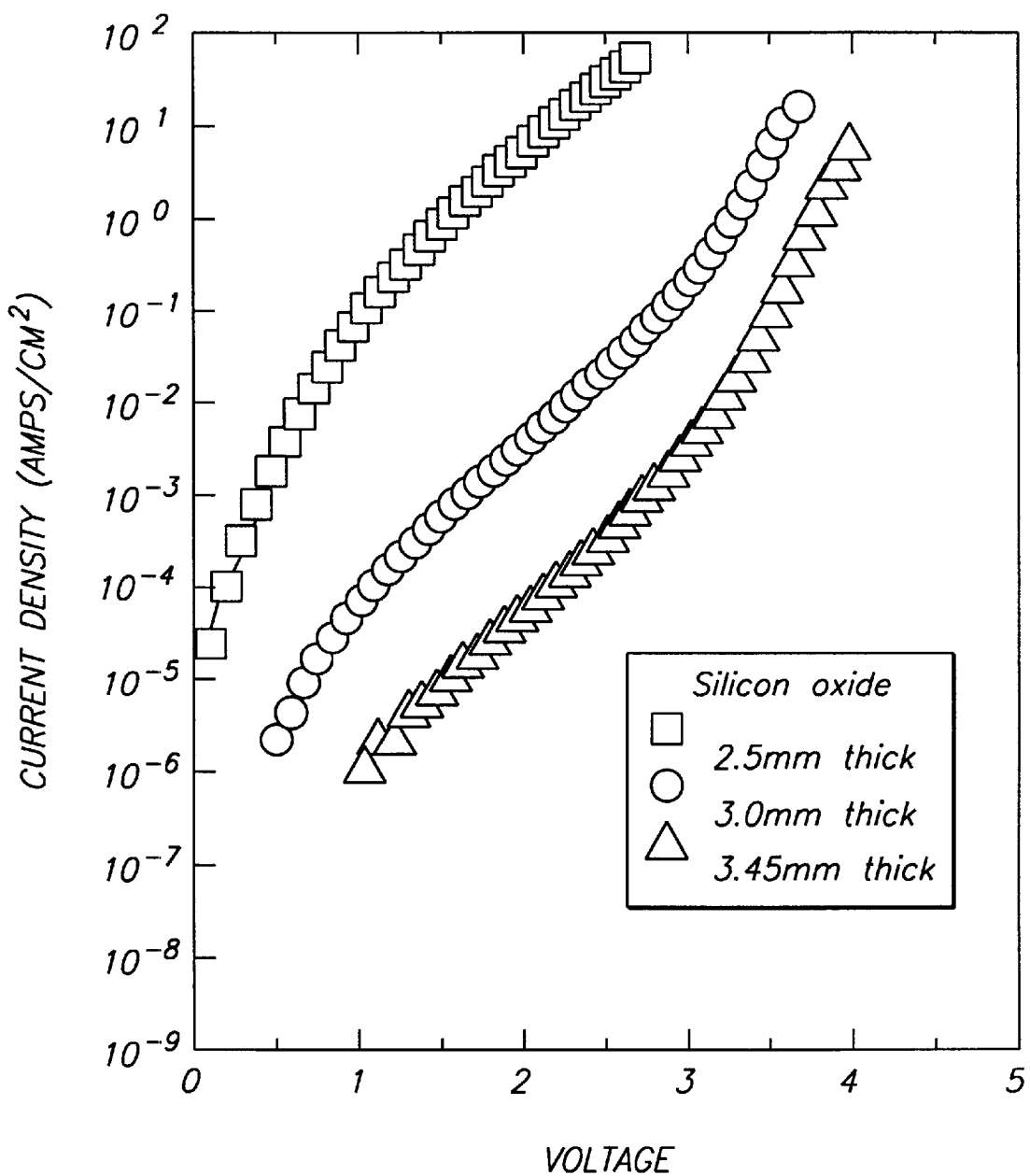
FIG. 5 is a graph of current density vs. voltage for silicon dioxide layers of varying thickness.

Certain advantageous aspects of utilizing thin dielectric layers in the resistors of the present invention may be appreciated by reference to FIGS. 5 and 6. In FIG. 5 a graph of current density vs. voltage is shown for silicon dioxide layers of varying thicknesses, in FIG. 6 a graph of current density vs. voltage is shown for silicon nitride layers of varying thicknesses. FIGS. 5 and 6 show that as voltage is increased, current increases within the thin dielectric layers of silicon dioxide and silicon nitride. Further, FIGS. 5 and 6 illustrate that as the thickness of a dielectric layer, either silicon nitride or silicon dioxide, is increased, there is an increasing current for a given voltage. Also, FIG. 5 and illustrate that as a dielectric material gets thinner, the current flow mechanism apparently changes, as evidenced by the change in shape of the curves for thick materials relative to thin materials. Specifically, for thicker materials the amount of change in voltage for a given change in current density is generally less than for thinner materials.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. An SRAM comprising:
   a semiconductive material substrate;
   a node location having a potential of Vcc;
   a pulldown transistor supported by the semiconductive substrate and comprising:
      a transistor gate structure which includes a gate oxide layer, polysilicon layer, silicide layer and insulative cap; and
      a pair of source/drain regions adjacent the transistor gate structure;
   an insulative material over the substrate and transistor gate structure, and having a pair of openings extending therethrough to the source/drain regions, the insulative material having an upper surface over the transistor gate structure;
   a resistor extending into one of the openings in the insulative material, and comprising:
      a first conductive layer in electrical connection with one of the source/drain regions of the pulldown transistor;
      a dielectric material over the first conductive layer and having a thickness of no greater than about 60 Angstroms;
      a second conductive layer over the dielectric material and in electrical connection with the node location; and
      wherein the first conductive layer, dielectric material, and second conductive layer only partially fill said one of the openings in the insulative material, and further wherein the first conductive layer, dielectric material and second conductive layer extend out of said one of the openings and over the upper surface of the insulative material; and
   the pull-down transistor being electrically connected to the node location having the potential of Vcc through the resistor.

2. The SRAM of claim 1 wherein the dielectric material is void of any implanted material.

3. The SRAM of claim 1 wherein the dielectric material comprises a thickness of at least about 15 Angstroms.

4. The SRAM of claim 1 wherein the dielectric material comprises silicon dioxide.

5. The SRAM of claim 1 wherein the dielectric material comprises silicon nitride.

6. An SRAM comprising:
   a semiconductive material substrate;
   a node location having a potential of Vcc;
   a pulldown transistor supported by the semiconductive substrate and comprising:
      a transistor gate structure which includes a gate oxide layer, polysilicon layer, silicide layer and insulative cap; and
      a pair of source/drain regions adjacent the transistor gate structure;
   an insulative material over the substrate and transistor gate structure, and having a pair of openings extending therethrough to the source/drain regions, the insulative material having an upper surface over the transistor gate structure;
   a resistor extending into one of the openings in the insulative material, and comprising:
      a dielectric material in electrical connection with one of the source/drain regions of the pulldown transistor and having a thickness of no greater than about 60 Angstroms; and a conductive layer over the dielectric material and in electrical connection with the node location; and wherein the dielectric material and conductive layer only partially fill said one of the openings in the insulative material, and further wherein the dielectric material and conductive layer extend out of said one of the openings and over the upper surface of the insulative material; and the pull-down transistor being electrically connected to the node location having the potential of Vcc through the resistor.

7. The SRAM of claim 6 wherein the dielectric material comprises a thickness of at least about 15 Angstroms.

8. The SRAM of claim 6 wherein the dielectric material is void of any implanted material.

9. A method of forming an SRAM comprising the following steps:

providing a semiconductive material substrate;

forming a pulldown transistor comprising a transistor gate structure and a pair of source/drain regions; the transistor gate structure including a gate oxide layer, polysilicon layer, silicide layer and insulative cap; the pull-down transistor being supported by the substrate;

forming an insulative material over the substrate and transistor gate structure, the insulative material having an upper surface over the transistor gate structure;

forming a pair of openings extending through the insulative material to the source/drain regions;

forming a first conductive layer in electrical connection with one of the source/drain regions of the pulldown transistor;

forming a dielectric material over the first conductive layer and having a thickness of no greater than about 60 Angstroms; and forming a second conductive layer over the dielectric material and in electrical connection with a node location having a potential of Vcc; the first conductive layer, dielectric material, and second conductive layer together defining a resistor which electrically connects the pulldown transistor to the node location; and wherein the first conductive layer, dielectric material, and second conductive layer extend out of said one of the openings and over the upper surface of the insulative material.

10. The method of claim 9 wherein the dielectric material is not implanted with an impurity.

11. A method of forming an SRAM comprising the following steps:

providing a semiconductive material substrate;

forming a pulldown transistor comprising a transistor gate structure and a pair of source/drain regions; the transistor gate structure including a gate oxide layer, polysilicon layer, silicide layer and insulative cap; the pull-down transistor being supported by the substrate;

forming an insulative material over the substrate and transistor gate structure, the insulative material having an upper surface over the transistor gate structure;

forming a pair of openings extending through the insulative material to the source/drain regions;

forming a dielectric material in electrical connection with one of the source/drain regions of the pulldown transistor and having a thickness of no greater than about 60 Angstroms; and forming a conductive layer over the dielectric material and in electrical connection with a node location having a potential of Vcc; the conductive layer and dielectric material together defining a resistor which electrically connects the pulldown transistor to the node location; and wherein the dielectric material, and conductive layer extend out of said one of the openings and over the upper surface of the insulative material and the dielectric material and conductive layer only partially fill said one of the openings in the insulative material.

* * * * *

UNITED STATES PATENT AND TRADEMARK OFFICE
CERTIFICATE OF CORRECTION

PATENT NO.   : 6,303,965 B1
DATED        : October 16, 2001
INVENTOR(S)  : Klaus Florian Schuegraf It is certified that error appears in the above-identified patent and that said Letters Patent is hereby corrected as shown below:

<u>Column 5,</u>
Line 51, replace "FIG. 5 and" with -- FIGS. 5 and 6 --

Signed and Sealed this

Seventh Day of May, 2002

*Attest:*

*Attesting Officer*

JAMES E. ROGAN
*Director of the United States Patent and Trademark Office*